(12) United States Patent
Mizuochi et al.

(10) Patent No.: US 11,988,729 B2
(45) Date of Patent: May 21, 2024

(54) MEASURING DEVICE AND MEASURING METHOD

(71) Applicants: Kyoto University, Kyoto (JP); SUMIDA CORPORATION, Tokyo (JP)

(72) Inventors: Norikazu Mizuochi, Kyoto (JP); Ernst David Herbschleb, Kyoto (JP)

(73) Assignees: KYOTO UNIVERSITY, Kyoto (JP); SUMIDA CORPORATION, Tokyo (JP)

(*) Notice: Subject to any disclaimer, the term of this patent is extended or adjusted under 35 U.S.C. 154(b) by 158 days.

(21) Appl. No.: 17/761,065

(22) PCT Filed: Sep. 3, 2020

(86) PCT No.: PCT/JP2020/033470
§ 371 (c)(1),
(2) Date: Mar. 16, 2022

(87) PCT Pub. No.: WO2021/054141
PCT Pub. Date: Mar. 25, 2021

(65) Prior Publication Data
US 2022/0349964 A1 Nov. 3, 2022

(30) Foreign Application Priority Data
Sep. 17, 2019 (JP) .................. 2019-168515

(51) Int. Cl.
*G01V 3/00* (2006.01)
*G01N 24/00* (2006.01)
*G01R 33/32* (2006.01)

(52) U.S. Cl.
CPC ......... *G01R 33/323* (2013.01); *G01N 24/006* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2010/0308813 A1    12/2010   Lukin et al.
2010/0321017 A1*   12/2010   Pines ................... G01R 33/302
                                                          324/309
(Continued)

FOREIGN PATENT DOCUMENTS

CN      108646203 A     10/2018
JP      2012103171 A    5/2012
(Continued)

OTHER PUBLICATIONS

International Search Report for International Application No. PCT/JP2020/033470 dated Nov. 24, 2020 with English translation attached, 6 pages.
(Continued)

*Primary Examiner* — Walter L Lindsay, Jr.
*Assistant Examiner* — Frederick Wenderoth
(74) *Attorney, Agent, or Firm* — MH2 TECHNOLOGY LAW GROUP, LLP

(57) ABSTRACT

In a measurement using a quantum sensor, the range of measurable physical quantities is increased while maintaining sensor sensitivity. A measuring device (10) comprises an irradiation unit (2) that irradiates a quantum sensor element (1) with electromagnetic waves for operating an electron spin state of the quantum sensor element (1) that changes due to interaction (8) with a measurement target (9), in a pulse sequence in which a time τ between n/2 pulses is a variable value; and a physical quantity measuring unit (3)
(Continued)

that calculates a physical quantity of the measurement target based on the electron spin state after the interaction with the measurement target (9).

12 Claims, 14 Drawing Sheets

(58) Field of Classification Search
USPC .......................................................... 324/304
See application file for complete search history.

(56) References Cited

U.S. PATENT DOCUMENTS

| | | | |
|---|---|---|---|
| 2014/0035584 A1* | 2/2014 | Twitchen | B01L 3/502707 324/321 |
| 2015/0048822 A1 | 2/2015 | Walsworth et al. | |
| 2015/0090033 A1 | 4/2015 | Budker et al. | |
| 2015/0256270 A1* | 9/2015 | Paller | H01L 31/18 398/202 |
| 2015/0377865 A1* | 12/2015 | Acosta | A61B 5/055 435/7.1 |
| 2016/0161429 A1* | 6/2016 | Englund | G01N 21/6402 324/304 |

FOREIGN PATENT DOCUMENTS

| | | |
|---|---|---|
| JP | 2017075964 A | 4/2017 |
| WO | 2014051886 A1 | 4/2014 |

OTHER PUBLICATIONS

Herbschleb et al., "Ultra-long coherence times amongst room-temperature solid-state spins," Nature Communications, 2019, vol. 10, Article No. 3766, 6 pages.

\* cited by examiner

MEASURING DEVICE AND MEASURING METHOD

CROSS-REFERENCE TO RELATED APPLICATIONS

This application is a U.S. National Stage application of International Application No. PCT/JP2020/033470 filed 3 Sep. 2020, which claims priority to Japanese Application No. 2019-168515 filed 17 Sep. 2019, the entire disclosures of which are hereby incorporated by reference in their entireties.

TECHNICAL FIELD

The present invention relates to a measuring device and a measuring method, both of which use a quantum sensor.

BACKGROUND ART

Composite defects called "nitrogen-vacancy centers" are sometimes observed in the crystal structure of diamond. Nitrogen-vacancy centers have a pair of a nitrogen atom replacing the position of a carbon atom in the crystal lattice and a vacancy present in the position adjacent to the nitrogen atom (a carbon atom is missing), and are also called "NV centers." In addition to NV centers, composite defects called "silicon-vacancy centers" and "germanium-vacancy centers" are also sometimes observed in the crystal structure of diamond. These composite defects, including NV centers, are called "color centers."

NV centers show magnetic properties called "electron spin" in a state in which electrons are trapped in vacancies (a negative charge state, hereinafter referred to as "NV$^-$"). NV$^-$ shows a longer transverse relaxation time (decoherence time, hereinafter referred to as "$T_2$") compared with a state in which electrons are not trapped (a neutral state, hereinafter referred to as "NV$^0$"). That is, in the NV$^-$ electron spin state, after the magnetization of the electron spins aligned in the perpendicular direction of the external magnetic field (hereinafter referred to as "quantization axis") is tilted in the transverse direction, the individual directions are shifted due to the precessional motion of the individual spins, and it takes a long time for the transverse magnetization as a whole to disappear. Further, NV$^-$ also shows a long $\tau_2$ value even at room temperature (about 300 K).

The NV$^-$ electron spin state changes in response to the external magnetic field, and this electron spin state can be measured at room temperature. Therefore, diamond containing NV centers can be used as a material for magnetic field sensor elements.

For example, PTL 1 discloses a method for measuring an alternating magnetic field by magnetic resonance of electron spins in diamond. Pulse sequences based on the spin-echo method are applied to the spins.

For example, PTL 2 discloses a method for measuring an alternating magnetic field by optically detected magnetic resonance (ODMR) of electron spins in diamond. The NV center is excited by laser light, and changes in the intensity of the fluorescence emitted from the NV center are measured to thereby detect the magnetic resonance signal related to the spin state (phase information).

In addition to a sensor using color centers in diamond, examples of sensors used as magnetic field sensor elements include various types of sensors, such as a sensor using color centers in silicon carbide (SiC), an optically pumped atomic magnetometer (OPM), and a superconducting quantum interference device (SQUID). These color centers in diamond, color centers in silicon carbide, optically pumped atomic magnetometer, and superconducting quantum interference device are called "quantum sensors" because they use quantum effects to measure physical quantities.

CITATION LIST

Patent Literature

PTL 1: JP2012-103171A
PTL 2: JP2017-75964A

SUMMARY OF INVENTION

Technical Problem

Magnetic field sensors using color centers in diamond are very highly sensitive, and thus can measure feeble magnetic fields. However, the range of magnetic fields etc. that can be measured by a magnetic resonance method using pulse sequences based on the spin-echo method is limited to a predetermined range (e.g., a range of about 5×10$^3$), and it is not possible to detect magnetic fields etc. that exceed the measurable range.

For example, it is assumed that the presence or absence of failure due to overcurrent in a certain device is to be detected in advance by measuring magnetic fields. In such a case, it is required to measure a magnetic field due to the occurrence of a large overcurrent caused by the failure of the device, as well as a magnetic field due to a slight leakage of current, which is a sign that the device is about to fail. However, if the range of the magnetic field strength that can be measured by a magnetic field sensor is narrow, and the measurable range does not include both the strength of the magnetic field due to leakage current and the strength of the magnetic field due to overcurrent, such a measurement cannot be performed, thus failing to detect the presence or absence of failure in advance. In the measurement of magnetic fields etc. using color centers in diamond as sensors, it is required to increase the range of measurable magnetic fields etc., that is, to increase the dynamic range of measurable magnetic fields etc.

An object of the present invention is to increase the range of measurable physical quantities in a measurement using a quantum sensor, while maintaining sensor sensitivity.

Solution to Problem

The present invention for achieving the above object includes, for example, the embodiments shown below.

Item 1.

A measuring device comprising: an irradiation unit that irradiates a quantum sensor element with electromagnetic waves for operating an electron spin state of the quantum sensor element that changes due to interaction with a measurement target, in a pulse sequence in which a time τ between Π/2 pulses is a variable value; and a physical quantity measuring unit that calculates a physical quantity of the measurement target based on the electron spin state after the interaction with the measurement target.

Item 2.

The measuring device according to Item 1, wherein the irradiation unit irradiates the quantum sensor element with the electromagnetic waves for operation in a plurality of pulse sequences with different times τ between Π/2 pulses.

Item 3.

The measuring device according to Item 2, wherein the physical quantity measuring unit calculates the physical quantity by combining a plurality of the electron spin states in a plurality of the pulse sequences based on a method of inferential statistics.

Item 4.

The measuring device according to Item 3, wherein the method of inferential statistics is Bayes' estimation.

Item 5.

The measuring device according to any one of Items 1 to 4, wherein the pulse sequence comprises:

application of a first Π/2 pulse to tilt an electron spin along a quantization axis to a plane perpendicular to the quantization axis, application of a n pulse to invert the electron spin dephased by the interaction with the measurement target in the plane after a first time $\tau_1$ from the first Π/2 pulse, and application of a second Π/2 pulse to project the dephased electron spin onto the quantization axis after a second time $\tau_2$ from the n pulse; and wherein the first time $\tau_1$ and the second time $\tau_2$ are variable values according to the intensity of the physical quantity of the measurement target.

Item 6.

The measuring device according to any one of Items 1 to 4, wherein the pulse sequence comprises:

application of a third Π/2 pulse to tilt an electron spin along a quantization axis to a plane perpendicular to the quantization axis, and application of a fourth Π/2 pulse to project the electron spin dephased by the interaction with the measurement target onto the quantization axis after a third time $\tau_3$ from the third Π/2 pulse; and wherein the third time $\tau_3$ is a variable value according to the intensity of the physical quantity of the measurement target.

Item 7.

The measuring device according to any one of Items 1 to 6, wherein the physical quantity measuring unit comprises:

a light irradiation part that irradiates the quantum sensor element with light for reading phase information of the electron spin state after the interaction with the measurement target;

a detection part that detects a change generated in the quantum sensor element due to the irradiation of the light; and a data processing part that reads the phase information from the detected change and calculates the physical quantity based on the read phase information.

Item 8.

The measuring device according to any one of Items 1 to 7, wherein the quantum sensor element is a sensor element having a color center.

Item 9.

The measuring device according to Item 8, wherein the color center is a complex of nitrogen (N) replacing a carbon atom and a vacancy (V) adjacent to the nitrogen.

Item 10.

The measuring device according to any one of Items 1 to 9, wherein the physical quantity measuring unit calculates at least one of a magnetic field, an electric field, a temperature, and a dynamic quantity as the physical quantity related to interaction with the electron spin.

Item 11.

A measuring method comprising the steps of:

irradiating a quantum sensor element with electromagnetic waves for operating an electron spin state of the quantum sensor element that changes due to interaction with a measurement target, in a pulse sequence in which a time $\tau$ between Π/2 pulses is a variable value; and calculating a physical quantity of the measurement target based on the electron spin state after the interaction with the measurement target.

Item 12.

The measuring method according to Item 11, wherein the step of calculating the physical quantity comprises:

irradiating the quantum sensor element with light for reading phase information of the electron spin state after the interaction with the measurement target;

detecting a change generated in the quantum sensor element due to the irradiation of the light; and reading the phase information from the detected change and calculating the physical quantity based on the read phase information.

Advantageous Effects of Invention

The present invention can increase the range of measurable physical quantities in a measurement using a quantum sensor, while maintaining sensor sensitivity.

DESCRIPTION OF EMBODIMENTS

Figure 1:
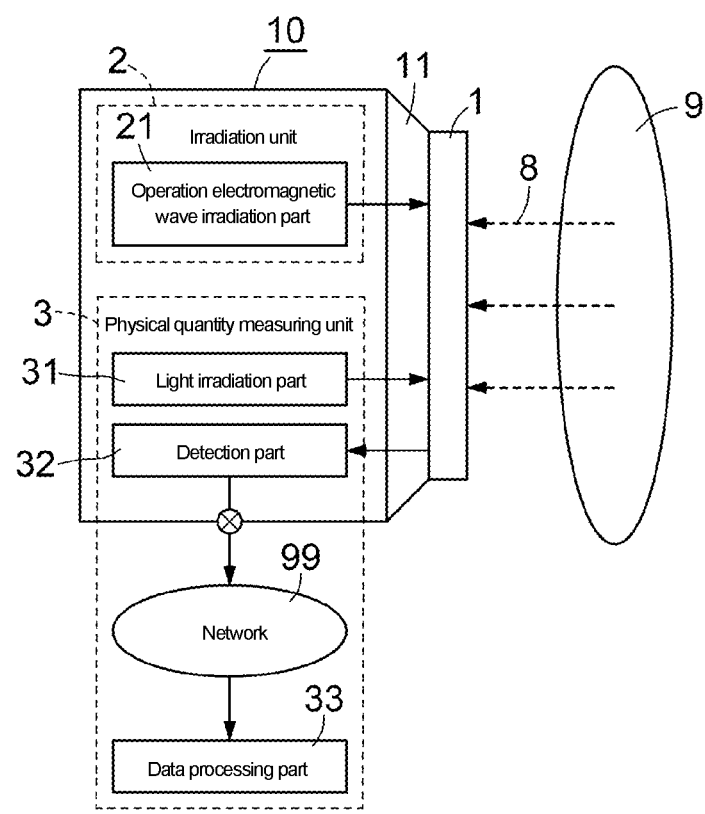
FIG. 1 is a view schematically showing an outline structure of a measuring device according to one embodiment of the present invention.

Embodiments of the present invention are described in detail below with reference to the attached drawings. In the following description and drawings, the same reference numerals indicate the same or similar components, and thus duplicate descriptions of the same or similar components are omitted.

In the present specification, "physical quantity" means a quantity whose dimensions are fixed under a certain system in physics and which can be expressed as a multiple of a defined physical unit. Examples of physical quantities include magnetic fields, electric fields, temperatures, and dynamic quantities (e.g., dynamic stress and pressure). Magnetic fields, electric fields, and dynamic quantities include physical quantities that do not change with time, and physical quantities that change direction repeatedly with time. That is, magnetic fields include a static magnetic field and an alternating magnetic field, electric fields include an electrostatic field and an alternating electric field, and dynamic quantities include a static dynamic quantity and an alternating dynamic quantity.

First Embodiment

As an example of the physical quantities of a measurement target, the first embodiment of the present invention describes a case of measuring the strength of the alternating magnetic field generated from the measurement target.

Device Structure

FIG. 1 schematically shows an outline structure of a measuring device 10 according to one embodiment of the present invention.

The measuring device 10 comprises a sensor element 1, an irradiation unit 2, and a physical quantity measuring unit 3. As an example, in the present embodiment, a confocal laser scanning microscope can be used to configure the measuring device 10.

The sensor element 1 is a quantum sensor element. In the present embodiment, the sensor element 1 is a diamond crystal having a color center, and an NV center is used as the color center. The NV center is a composite (composite defect) of nitrogen (N) replacing a carbon atom and a vacancy (V) adjacent to the nitrogen. In the present embodiment, the sensor element 1 is attached to the tip of a probe 11 of the measuring device 10.

The electron spin state of the sensor element 1 changes due to interaction 8 with the measurement target 9. In the present embodiment, the interaction 8 is interaction with an alternating magnetic field. When the interaction 8 is based on an alternating magnetic field, the electron spin state of the color center of the sensor element 1 corresponds to the strength of the alternating magnetic field generated from the measurement target 9.

The irradiation unit 2 comprises an operation electromagnetic wave irradiation part 21. In the present invention, the electromagnetic waves for operating the electron spin state of the sensor element 1 are applied to the sensor element 1 in the form of pulsed waves. The operation electromagnetic wave irradiation part 21 applies the operation electromagnetic waves to the sensor element 1 with a pulse sequence in which the time τ between Π/2 pulses is a variable value. The operation electromagnetic wave irradiation part 21 preferably applies the operation electromagnetic waves to the sensor element 1 with a plurality of pulse sequences with different times τ between Π/2 pulses. The pulse sequences applied by the operation electromagnetic wave irradiation part 21 are described later with reference to FIG. 2. A known microwave (MW) oscillator can be used as the operation electromagnetic wave irradiation part 21.

The physical quantity measuring unit 3 calculates the physical quantity of the measurement target 9 based on the electron spin state of the sensor element 1 after the interaction with the measurement target 9. The physical quantity measuring unit 3 preferably calculates the physical quantity by combining a plurality of electron spin states by a plurality of pulse sequences with different times τ between Π/2 pulses based on a method of inferential statistics. In the present embodiment, the physical quantity measuring unit 3 calculates the strength of the alternating magnetic field generated from the measurement target 9. The physical quantity measuring unit 3 comprises a light irradiation part 31, a detection part 32, and a data processing part 33.

The light irradiation part 31 irradiates the sensor element 1 with light for reading the phase information of the electron spin state of the sensor element 1 after the interaction with the measurement target 9. Further, the light irradiation part 31 irradiates the sensor element 1 with light for initializing the electron spin state of the sensor element 1. For the light irradiation part 31, for example, various known laser generators can be used. As an optional structure, the light irradiation part 31 may comprise an acoustic optical modulator (AOM).

The detection part 32 detects a change generated in the sensor element 1. In the present embodiment, the detection part 32 detects the light emitted from the sensor element 1, thereby detecting the magnetic resonance signal as a change in luminescence intensity by known optically detected magnetic resonance (ODMR). In this case, for example, a known photodiode can be used as the detection part 32. The photodiode can be, for example, an avalanche photodiode.

In the present embodiment, the irradiation unit 2 applies the operation electromagnetic waves in pulsed form. Therefore, in the present embodiment, detection is specifically performed by pulsed optically detected magnetic resonance (pODMR).

The data processing part 33 is connected to the detection part 32, reads the phase information of the electron spin state of the sensor element 1 after the interaction with the measurement target 9 from the change detected by the detection part 32, and calculates the physical quantity of the measurement target 9 based on the read phase information. In the present embodiment, the data processing part 33 calculates the strength of the alternating magnetic field generated from the measurement target 9. For the data processing part 33, for example, known general-purpose computers or various information terminal devices, such as smartphones, can be used.

The data processing part 33 may be integrated with the measuring device 10, or may be provided outside the measuring device 10 and connected to the measuring device 10 via a network 99, as shown in the drawing.

Measurement Principle

Figure 14:
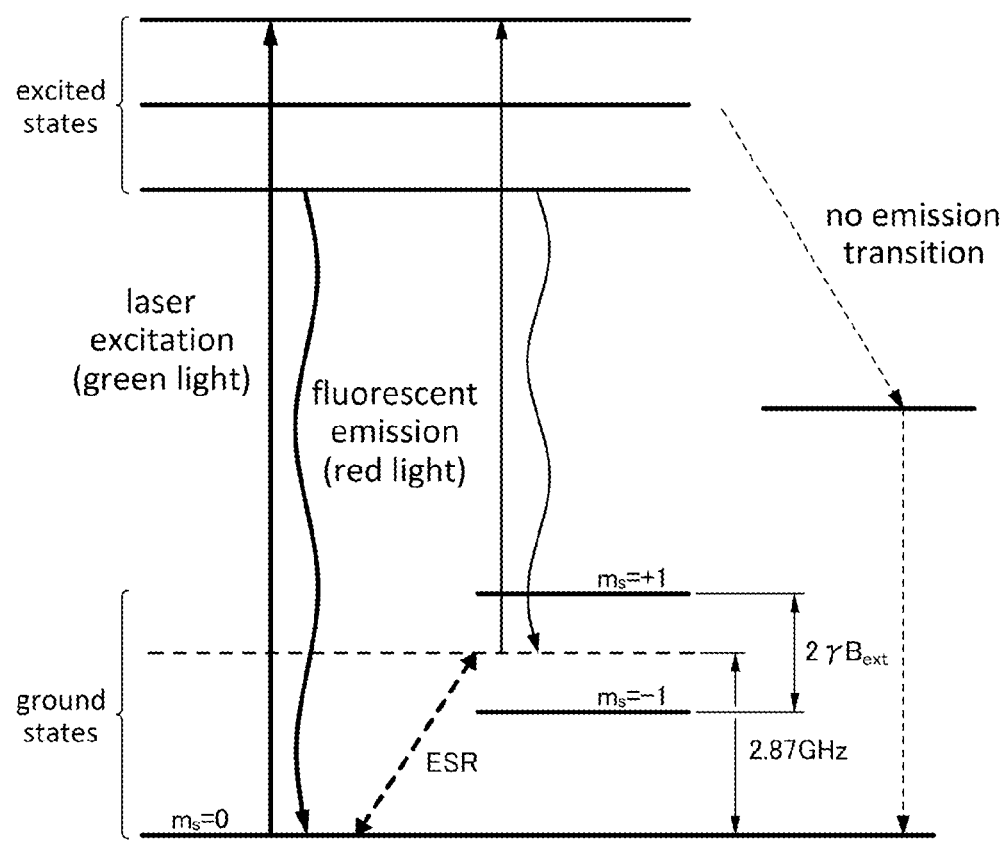
FIG. 14 is a view schematically showing electron energy levels in the NV$^-$ center in diamond.

FIG. 14 is a view schematically showing electron energy levels in the NV⁻ center in diamond.

In the present embodiment, an NV center in diamond is used as the sensor element 1. The ground state of the NV center is a spin triplet state in which magnetic quantum number $m_s=-1, 0, +1$. In the steady state at room temperature, all levels are equally distributed in the ground state.

When irradiated with laser light at a wavelength of 532 nm (green), an electron with a magnetic quantum number $m_s$ of 0 in the ground state transits to the excited state, emits red fluorescence, and is relaxed to the ground state with a magnetic quantum number $m_s$ of 0.

On the other hand, when irradiated with microwaves at a resonant frequency of 2.87 GHz, the electron with a magnetic quantum number $m_s$ of 0 in the ground state produces electron spin resonance (ESR), and transits to a double-degenerate ground state with a magnetic quantum number $m_s$ of ±1. When irradiated with laser light at a wavelength of 532 nm (green), the electron with a magnetic quantum number $m_s$ of ±1 in such a ground state transits to the excited state, and then returns to the ground state with a magnetic quantum number $m_s$ of 0 at a fixed probability. This series of processes is non-radiative transition without emission of fluorescence.

Thus, the process of emitting red fluorescence is less likely to occur when magnetic resonance occurs and the electron is in the ground state with a magnetic quantum number $m_s$ of ±1. Further, the double-degenerate ground state with a magnetic quantum number $m_s$ of ±1 is separated by Zeeman splitting in proportion to the strength of the external magnetic field; thus, the fluorescence intensity also changes depending on whether the electron is in the state with a magnetic quantum number $m_s$ of +1 or −1. Therefore, the magnetic resonance signal can be detected as a point where the red fluorescence intensity is reduced when the microwave frequency is swept at around 2.87 GHz.

Pulse Sequence by Existing Method

Figure 15:
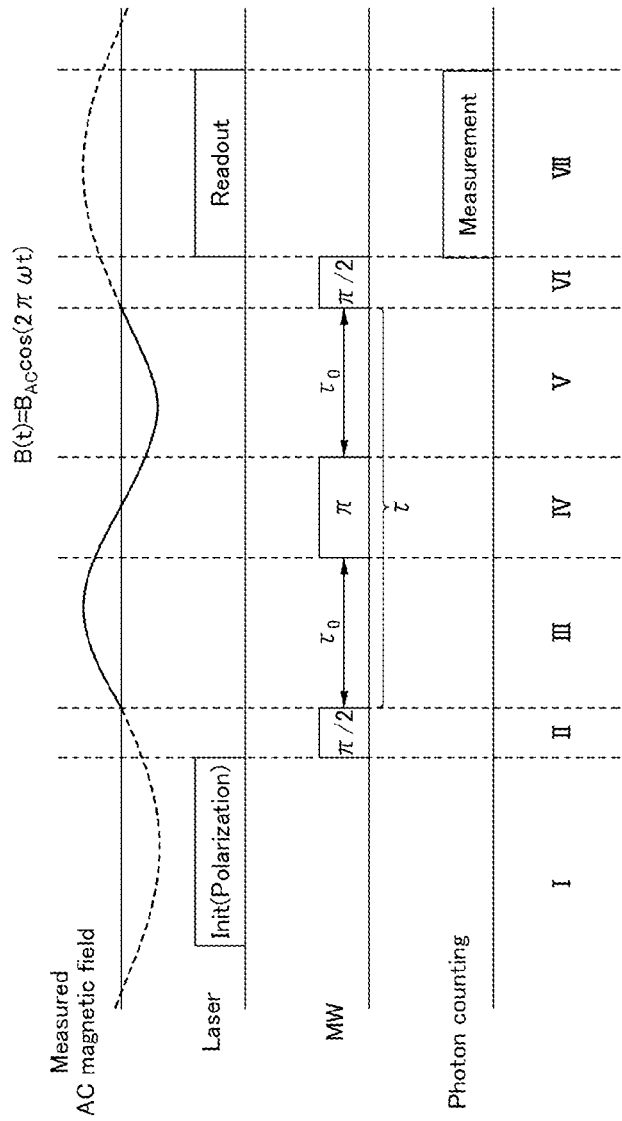
FIG. 15 shows pulse sequences in the case of alternating magnetic field sensing by an existing method using optically detected magnetic resonance.

FIG. 15 shows pulse sequences in the case of alternating magnetic field sensing by an existing method using optically detected magnetic resonance. The pulse sequences of operation electromagnetic waves shown in FIG. 15 are based on the Hahn-echo method of the spin-echo method.

State I shows a state in which the electron spin is initialized by irradiation with laser light. In a Bloch sphere, which is a notation for expressing the quantum state on the unit sphere, the electron spin is aligned in the direction along the z-axis, which is the quantization axis.

Next, in state II, an operation is carried out to tilt the electron spin along the quantization axis to a plane perpendicular to the quantization axis by applying a Π/2 pulse. The electron spin is tilted to the x-y plane. Then, in state III, the electron spin tilted to the x-y plane is dephased by the interaction between the alternating magnetic field and the static magnetic field during a predetermined time $\tau_0$. The strength of the interaction corresponds to the strength of the magnetic field felt by the electron spin.

After the elapse of a predetermined time $\tau_0$ in state III, an operation is carried out to invert the electron spin, which is dephased by the interaction with the measurement target, in the plane by applying a n pulse in state IV. In states III to IV, the electron spin is rotated in the x-y plane. In this case, in state V after inversion, the reconvergence of the electron spin cancels the static magnetic field component; however, the alternating magnetic field component is not canceled because the strength is reversed in comparison to state III.

After the elapse of a further predetermined time $\tau_0$ in state V, an operation is carried out to project the dephased electron spin onto the quantization axis by applying a Π/2 pulse in state VI. The electron spin located within the x-y plane is projected onto the z-axis, which is the quantization axis, and is aligned in the direction along the z-axis.

Then, in state VII, the sensor element is irradiated with laser light, and the light emitted from the sensor element is detected to thereby read the phase information of the electron spin state after the interaction. The measurement of the magnetic resonance signal related to the spin state (phase information) using such pulse sequences is repeatedly executed to integrate the signal intensity and improve S/N.

In the pulse sequences in the case of alternating magnetic field sensing by an existing method shown in FIG. 15, the time τ between Π/2 pulses is a fixed value corresponding to the wavelength 2Π of the alternating magnetic field to be measured, and the time $\tau_0$ of state III and the time $\tau_0$ of state V are also fixed values. As described with reference to FIG. 15, the electron spin is dephased from states III to V while being rotated in the x-y plane. If the strength of the alternating magnetic field is large, the rotation angle of the electron spin in the x-y plane exceeds 2Π. If the strength of the alternating magnetic field is small, the rotation angle of the electron spin in the x-y plane becomes insufficient, and the strength of the alternating magnetic field may not be measured.

Under such circumstances, the existing method puts limits relating to the rotation angle of the electron spin in the x-y plane on the strength of the alternating magnetic field to be measured. Along with this, limits corresponding to the time τ are also put on the range of the measurable alternating magnetic field strength. When the time τ is fixed, the range of the alternating magnetic field is also fixed.

Pulse Sequences by Method of Present Invention

Figure 2:
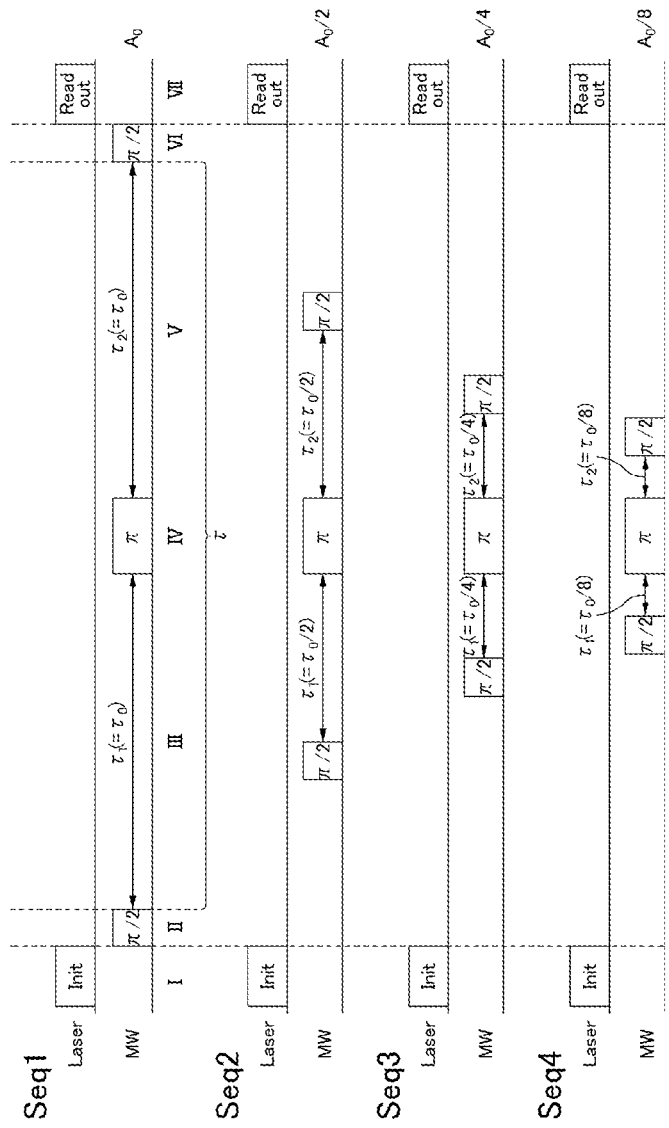
FIG. 2 shows pulse sequences in the case of alternating magnetic field sensing by a measuring method according to one embodiment of the present invention.

FIG. 2 shows pulse sequences in the case of alternating magnetic field sensing by the measuring method according to one embodiment of the present invention. The pulse sequences of operation electromagnetic waves shown in FIG. 2 are based on the Hahn-echo method of the spin-echo method, and the time τ between Π/2 pulses is a variable value.

In the pulse sequences by the existing method described with reference to FIG. 15, the time τ between Π/2 pulses is a fixed value corresponding to the wavelength 2Π of the alternating magnetic field to be measured, and the time $\tau_0$ of state III and the time $\tau_0$ of state V are also fixed values.

In contrast, in the pulse sequences by the method of the present invention, the time τ between Π/2 pulses is a variable value corresponding to the strength of the alternating magnetic field to be measured. As described for the pulse sequences by the existing method, the time τ between Π/2 pulses is set depending on the strength of the alternating magnetic field to be measured. Therefore, by setting the time τ between Π/2 pulses as a variable value in the pulse sequences used in the measurement, mixing a time τ for measuring a high alternating magnetic field strength and a time τ for measuring a low alternating magnetic field strength makes it possible to increase the range of the measurable alternating magnetic field strength, namely to increase the dynamic range of the measurable alternating magnetic field strength, while maintaining required measurement sensitivity to the same extent as the measurement using conventional pulse sequences.

When an attempt is made to set various lengths of time τ for given pulse sequences in order to set the time τ as a variable value, if there is a single variation of the pulse sequences, the range of the rotation angle of the electron spin in the x-y plane may not be within the dynamic range; that is, the strength of the alternating magnetic field may not be measured. Therefore, the method of the present invention uses a plurality of pulse sequences with different times τ between Π/2 pulses. As described later with reference to FIGS. 3 and 4, in the method of the present invention, a plurality of results using a plurality of pulse sequences are combined based on Bayes' theorem to thereby determine the measured value of the strength of the alternating magnetic field.

This is described in detail with reference to FIG. 2. In the method of the present invention, during the period in which the magnetic resonance signal related to the spin state is repeatedly measured to integrate the signal intensity, the magnetic resonance signal is measured while changing the pulse sequence of the operation electromagnetic waves to any of a plurality of pulse sequences with different times τ between Π/2 pulses. In the present embodiment, the magnetic resonance signal is measured while changing the pulse sequence of the operation electromagnetic waves in the order from the first pulse sequence Seq1 to the fourth pulse sequence Seq4 shown in FIG. 2.

In the exemplary pulse sequences shown in the present embodiment, the time $\tau_1$ of state III and the time $\tau_2$ of state V are the same length of time. That is, in the exemplary pulse sequences, a π pulse is applied at an intermediate timing between two Π/2 pulses. These times $\tau_1$ and $\tau_2$ are variable values corresponding to the strength of the alternating magnetic field to be measured.

For example, when the time $\tau_1$ of state III and the time $\tau_2$ of state V in the first pulse sequence Seq1 are set as the same time $\tau_0$, in the present embodiment, the time $\tau_1$ of state III and the time $\tau_2$ of state V in the second pulse sequence Seq2 to the fourth pulse sequence Seq4 are multiples of the time $\tau_1$ of state III and the time $\tau_2$ of state V in the first pulse sequence Seq1.

Specifically, in the present embodiment, the time $\tau_1$ of state III and the time $\tau_2$ of state V in the second pulse sequence Seq2 are a time $\tau_0/2$, which is half of the time $\tau_0$ in the first pulse sequence Seq1. Similarly, the time $\tau_1$ of state III and the time $\tau_2$ of state V in the third pulse sequence Seq3 are a time $\tau_0/4$, which is one-fourth of the time $\tau_0$ in the first pulse sequence Seq1, and the time $\tau_1$ of state III and the time $\tau_2$ of state V in the fourth pulse sequence Seq4 are a time $\tau_0/8$, which is one-eighth of the time $\tau_0$ in the first pulse sequence Seq1.

In the present embodiment, the timing of applying laser light for initializing the electron spin in state I, and the timing of applying laser light for reading the phase information and detecting the emitted light in state VII do not change among the first pulse sequence Seq1 to fourth pulse sequence Seq4.

Figure 3:
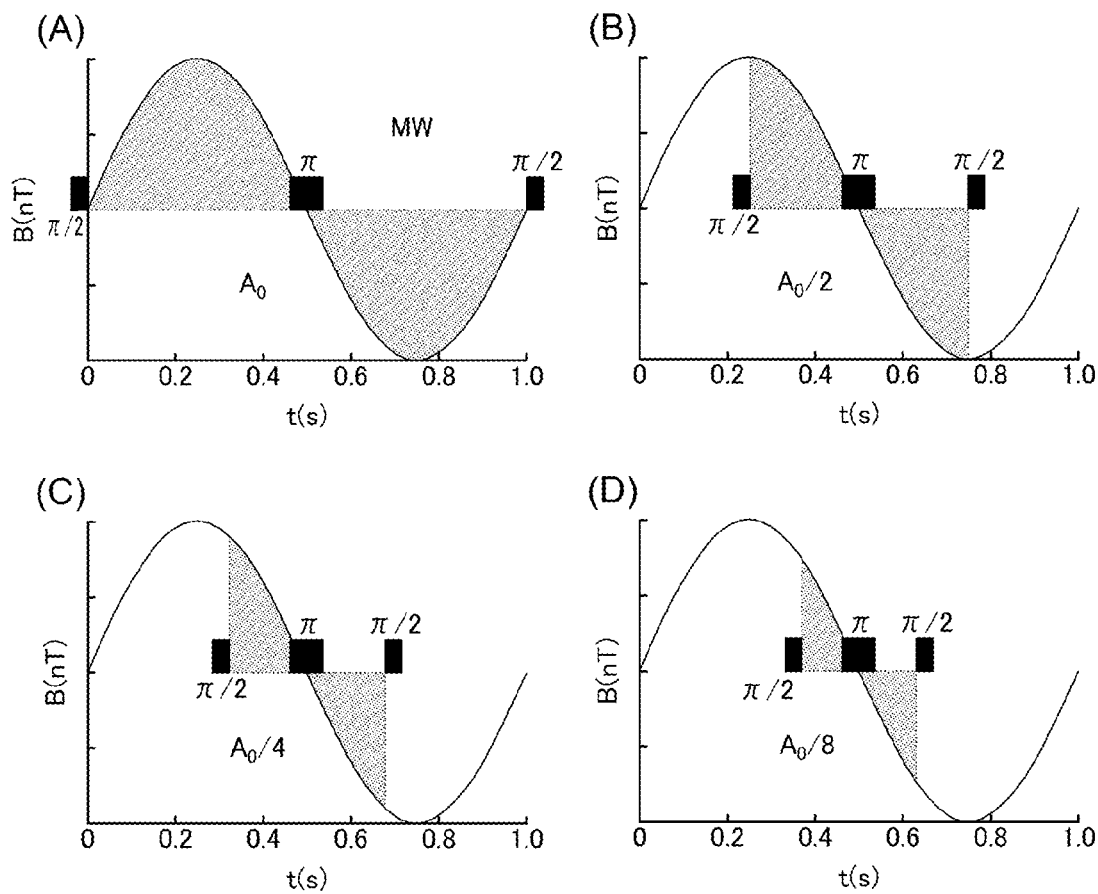
FIG. 3 is a view for explaining the measurement principle by the present invention.
Figure 4:
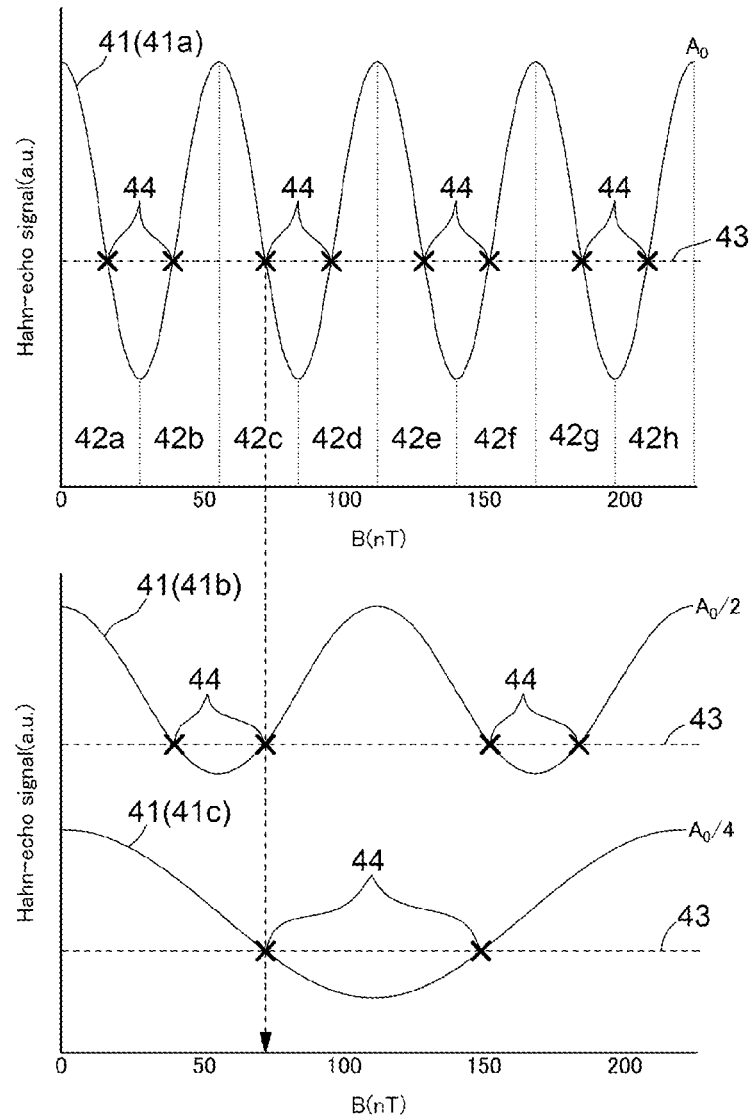
FIG. 4 is a view for explaining the measurement principle by the present invention.

FIGS. 3 and 4 are views for explaining the measurement principle by the present invention.

As shown in FIGS. 3 (A) to (D), when the time between Π/2 pulses is changed in the pulse sequences based on the spin-echo method, the integrated value of the strength of the magnetic field felt by the electron spin changes in the x-y plane of the Bloch sphere.

For example, in the pulse sequence shown in (A), when the integrated value of the strength of the magnetic field felt by the electron spin is $A_0$, the integrated value of the strength of the magnetic field felt by the electron spin is $A_0/2$ in the pulse sequence shown in (B) in which the time between Π/2 pulses is shortened by half. Similarly, in the pulse sequence shown in (C), the time between Π/2 pulses is further shortened, and the integrated value of the strength of the magnetic field felt by the electron spin is about $A_0/4$. In the pulse sequence shown in (D), the time between Π/2 pulses is further shortened, and the integrated value of the strength of the magnetic field felt by the electron spin is about $A_0/8$. Thus, when the time between Π/2 pulses changes in the pulse sequences based on the spin-echo method, the integrated value of the strength of the magnetic field felt by the electron spin changes in the x-y plane of the Bloch sphere. As expressed by the term "about," the integrated value of the strength of the magnetic field felt by the electron spin is not strictly proportional to the time between Π/2 pulses. This is because the time change in the magnetic field strength is represented by the sine function.

Reference is made to FIG. 4. In the spin-echo method, the electron spin is rotated in the x-y plane of the Bloch sphere; thus, measurement signals 41 (41a to 41c) by the spin-echo method vibrate as shown in FIG. 4. As described with reference to the pulse sequences shown in FIGS. 15 and 2, in the spin-echo method, the degree that the electron spin is rotated in the x-y plane and dephased increases according to the integrated value of the strength of the magnetic field felt by the electron spin. Therefore, in the spin-echo method, the strength of the magnetic field measured is limited to a certain range. FIG. 4 shows exemplary ranges of the magnetic field strength measured (signs 42a to 42h). For example, when the intensity of the measurement signal 41 is a signal intensity indicated by the dashed line 43, the measured values of the magnetic field determined for the ranges 42a to 42h are given at measurement points 44 indicated by the cross symbols "x."

In the measurement signal 41a corresponding to the integrated value $A_0$ of the strength of the magnetic field, there are eight measurement points 44 corresponding to given signal intensities on the dashed line 43. In the measurement signal 41b corresponding to the integrated value $A_0/2$ of the strength of the magnetic field, there are four measurement points 44 corresponding to given signal intensities on the dashed line 43. The reason why the period of the measurement signal 41b is twice the period of the measurement signal 41a is because the integrated value of the strength of the magnetic field felt by the electron spin is reduced by a factor of ½, and the degree that the electron spin is rotated in the x-y plane is reduced by a factor of ½. Similarly, in the measurement signal 41c corresponding to the integrated value $A_0/4$ of the strength of the magnetic field, there are two measurement points 44 corresponding to certain signal intensities on the dashed line 43. The reason why the period of the measurement signal 41c is four times the period of the measurement signal 41a is because the integrated value of the strength of the magnetic field felt by the electron spin is reduced by a factor of about ¼, and the degree that the electron spin is rotated in the x-y plane is reduced by a factor of ¼. That is, when the integrated value of the strength of the magnetic field felt by the electron spin is reduced, the frequency of the measurement signal 41 is also reduced, and the number of measurement points 44 corresponding to given signal intensities is also reduced.

In the method of the present invention, as shown in FIG. 4, a plurality of measurement signals 41 corresponding to integrated values of different magnetic field strengths are combined to thereby uniquely determine the measured value within the range limited by the integrated value of the minimum magnetic field strength. This is achieved by measuring the magnetic resonance signal while changing the pulse sequence of operation electromagnetic waves to any of a plurality of pulse sequences with different times between Π/2 pulses.

The multiple measurement signals 41 (41a to 41c) obtained from the integrated values of different magnetic field strengths are combined through Bayes' theorem, and the measured value of the magnetic field strength is determined based on Bayes' estimation method. Assuming that a measurement signal $S_n$ is given for an integrated value $A_n$ of a given magnetic field strength obtained by changing the time between Π/2 pulses, the posterior probability $P(B|S_n)$ of a magnetic field B given by the measurement signal $S_n$ is represented by the following equation:

$$P(B|S_n) = \frac{P(S_n|B)P(B)}{P(S_n)}$$

In this equation, P(B) is prior probability. $P(S_n)$ is independent from the magnetic field B, and is $$P(S_n|B) = P(S_n|f(B))$$

f(B) is a function that represents the relationship between the measurement signal $S_n$ and the magnetic field B. $P(S_n|S)$ is Poisson distribution. When more than 10 photons are detected, $P(S_n|S)$ can approximate the normal distribution. The function f(B) is given by the waveform of the measurement signal $S_n$ and the strength of the magnetic field B, as given as the measurement signals 41 (41a to 41c) in FIG. 4.

In the first measurement, the prior probability distribution is flat because there is no initial value for the magnetic field B. For the rest of the measurements, the previous posterior probability becomes new prior probability. For the rest of the measurements, the previous posterior probability becomes new prior probability.

Thus, when a plurality of probability distributions by a plurality of pulse sequences with different times between Π/2 pulses are combined based on Bayes' estimation method, the number of residual probability distribution peaks is reduced. On the other hand, the sharpness of the probability distribution peaks remains similar to that of the first measurement, and the measurement sensitivity is similarly maintained.

Method for Calculating Physical Quantity of Measurement Target

In optically detected magnetic resonance (ODMR), the phase information (magnetic resonance signal) of the electron spin state of the sensor element 1 after the interaction with the measurement target 9 is detected as a change in luminescence intensity. The detected phase information is in a state corresponding to the physical quantity of the measurement target. Therefore, the physical quantity of the measurement target can be calculated by appropriately processing the detected phase information of the electron spin state after the interaction. The physical quantity of the measurement target can be calculated based on the electron spin Hamiltonian.

The electron spin Hamiltonian $H_{gs}$ is represented by the following equation:

$$H_{gs} = \mu_B g_e S \cdot B + hD_{gs}[S_z^2 - \tfrac{1}{3}S(S+1)] - d_{gs}^\perp[E_x(S_xS_y + S_yS_x) + E_y(S_x^2 - S_y^2)]$$

In this equation, $\mu_B$ is the Bohr magneton, $g_e$ is the g-factor of the electron, and h is Planck's constant. Vector S is the electron spin. Vector B is the applied magnetic field. $D_{gs}$ is the zero magnetic field splitting constant. $S_X$, $S_Y$, and $S_Z$ are x, y, and z direction components of electron spin S, respectively. $d_{gs}^\perp$ is the electric dipole moment. $E_x$ and $E_y$ are x and y direction components of the electric field, respectively.

The First Term:

$$\mu_B g_e S \cdot B$$

is a term due to the Zeeman effect, and means that the electron spin functions as a magnetic field sensor.

The second and third terms are terms due to dipole interactions (i.e., inter-spin interactions). The second term:

$$hD_{gs}[S_z^2 - \tfrac{1}{3}S(S+1)]$$

means that the electron spin functions as a temperature sensor and a dynamic quantity (pressure) sensor. The third term:

$$-d_{gs}^\perp[E_x(S_xS_y + S_yS_x) + E_y(S_x^2 - S_y^2)]$$

means that the electron spin functions as an electric field sensor.

Accordingly, the strength of the magnetic field can be calculated based on the first term. The strength of the temperature and dynamic quantity can be calculated based on the second term. The strength of the electric field can be calculated based on the third term.

Measurement Procedure

Alternating Magnetic Field Sensing

Figure 5:
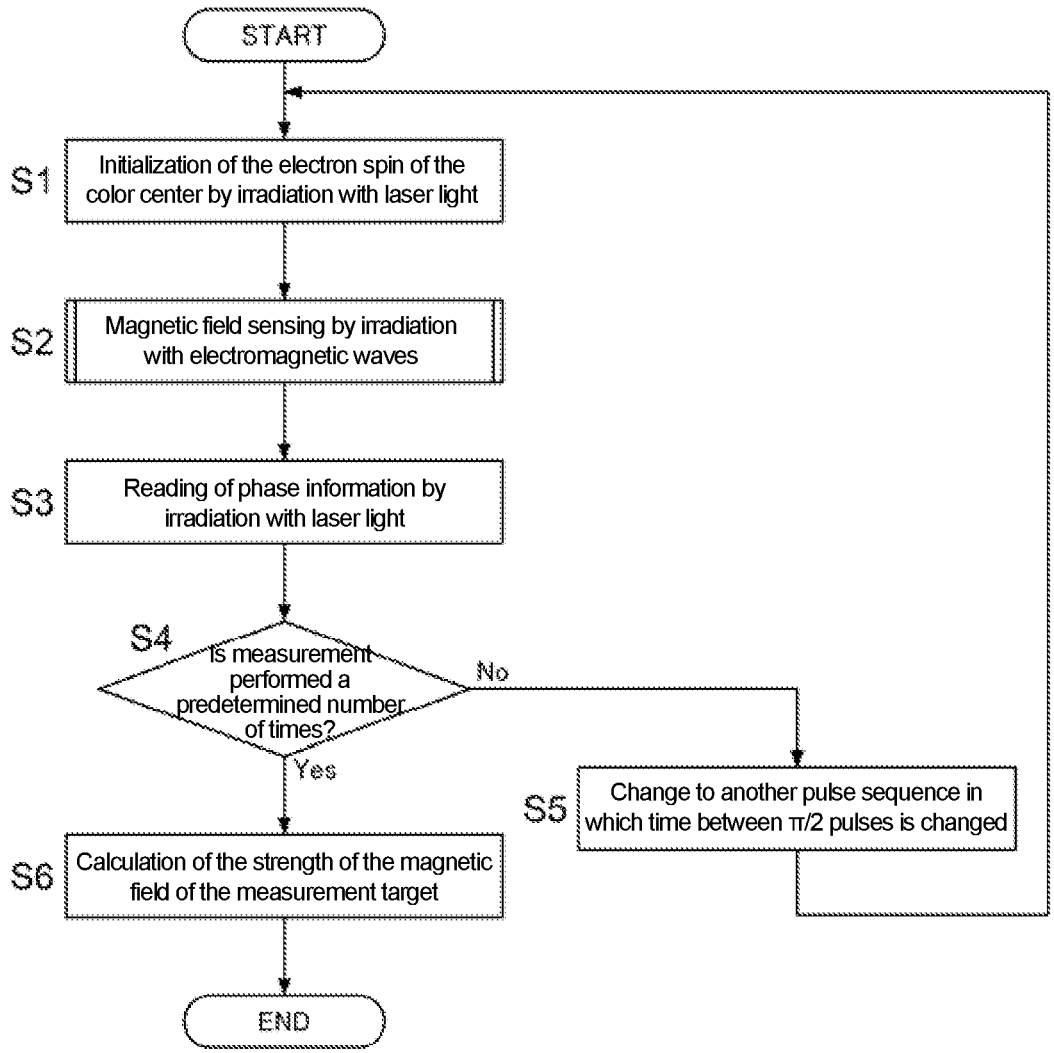
FIG. 5 is a flowchart showing the procedure of a measuring method according to one embodiment of the present invention.

FIG. 5 is a flowchart showing the procedure of a measuring method according to one embodiment of the present invention. The procedure in the case of alternating magnetic field sensing is described with reference to FIGS. 5 and 2.

In step S1, the electron spin of the color center (NV center) of the sensor element 1 is initialized by irradiating the sensor element 1 with laser light. Then, the initialized electron spin of the NV center is made to interact with the alternating magnetic field of the measurement target 9. After the interaction for a sufficient period of time, the electron spin state of the NV center becomes a state corresponding to the strength of the alternating magnetic field. The state of step S1 corresponds to state I of the pulse sequence shown in FIG. 2.

In step S2, magnetic field sensing is performed by irradiating the sensor element 1 with electromagnetic waves for spin operation. In the present embodiment, alternating magnetic field sensing is performed according to the procedure shown in steps S21A to S23A of FIG. 6.

Figure 6:
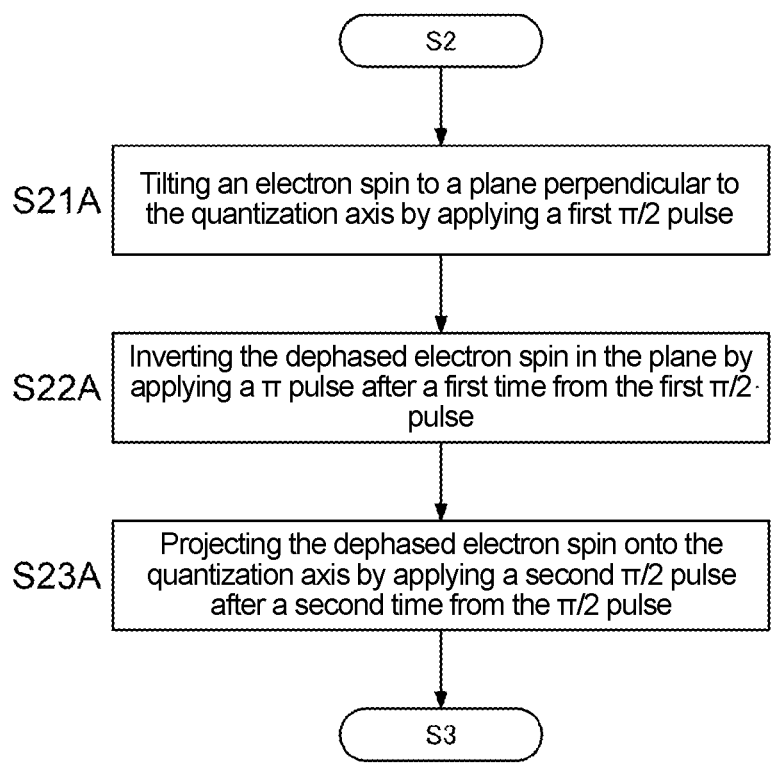
FIG. 6 is a flowchart showing the detailed procedure in the case of alternating magnetic field sensing.

FIG. 6 is a flowchart showing the detailed procedure in the case of alternating magnetic field sensing.

In step S21A, an operation is carried out to tilt the electron spin along the quantization axis to a plane perpendicular to the quantization axis by applying a first Π/2 pulse. The state of step S21A corresponds to state II of the pulse sequence shown in FIG. 2.

Then, the electron spin tilted to the x-y plane is dephased by the interaction between the alternating magnetic field and the static magnetic field during a first time $\tau_1$. The first time $\tau_1$ is a variable value that differs for each pulse sequence corresponding to the strength of the alternating magnetic field to be measured. The state in which the electron spin is dephased during the first time $\tau_1$ corresponds to state III of the pulse sequence shown in FIG. 2.

After the elapse of the first time $\tau_1$ from the first Π/2 pulse, in step S22A, an operation is carried out to invert the electron spin, which is dephased by the interaction with the measurement target, in the plane by applying a π pulse. The state of step S22A corresponds to state IV of the pulse sequence shown in FIG. 2.

Then, the electron spin inverted in the x-y plane is reconverged during a second time $\tau_2$. The second time $\tau_2$ is a variable value that differs for each pulse sequence corresponding to the strength of the alternating magnetic field to be measured. The state in which the electron spin is reconverged during the second time $\tau_2$ corresponds to state V of the pulse sequence shown in FIG. 2.

After the elapse of the second time $\tau_2$ from the n pulse, in step S23A, an operation is carried out to project the dephased electron spin onto the quantization axis by applying a second Π/2 pulse. The state of step S23A corresponds to state VI of the pulse sequence shown in FIG. 2.

Reference is made again to FIG. 5. In step S3, the phase information of the electron spin state after the interaction is read by detecting a change generated in the sensor element 1 after irradiating the sensor element 1 with laser light. In the present embodiment, the phase information of the electron spin state after the interaction is read by detecting the light emitted from the sensor element 1. The phase information of the electron spin state after the interaction is detected using the detection part 32 by optically detected magnetic resonance (ODMR) as a change in luminescence intensity. The state of step S3 corresponds to state VII of the pulse sequence shown in FIG. 2.

In step S4, it is determined whether the series of measurement processing of steps S1 to S3 is executed repeatedly a predetermined number of times. When the series of measurement processing is executed repeatedly a predetermined number of times (Yes in step S4), the processing of step S6 is performed. When the series of measurement processing is not executed repeatedly a predetermined number of times (No in step S4), the processing of step S5 is performed. For example, the number of times of repeating the series of measurement processing is about 10,000 or more.

Since the signal intensity is integrated when the series of measurement processing is repeatedly executed, the S/N ratio of signals increases as the number of times of repeatedly executing the measurement processing increases.

In step S5, the pulse sequence used in the measurement is changed to another pulse sequence in which the time between Π/2 pulses is changed. After the change to the other pulse sequence, the series of measurement processing of steps S1 to S3 is executed in the other pulse sequence after the change.

For example, when the immediately preceding series of measurement processing of steps S1 to S3 is performed in the first pulse sequence Seq1 shown in FIG. 2, the next series of measurement processing of steps S1 to S3 to be repeatedly executed is performed in the second pulse sequence Seq2. Similarly, when the immediately preceding series of measurement processing is performed in the second pulse sequence Seq2, the next series of measurement processing to be repeatedly executed is performed in the third pulse sequence Seq3. Afterword, the series of measurement processing of steps S1 to S3 is repeatedly executed while changing the pulse sequence used in the measurement in the order from the first pulse sequence Seq1 to the fourth pulse sequence Seq4.

In step S6, the strength of the magnetic field of the measurement target is calculated. The phase information of the electron spin state after the interaction detected by the detection part 32 is in a state corresponding to the alternating magnetic field of the measurement target 9. Therefore, the strength of the alternating magnetic field can be calculated by appropriately processing the detected phase information of the electron spin state after the interaction. For example, the strength of the alternating magnetic field of the measurement target 9 can be calculated by determining the probability that the electron spin state after the interaction becomes the ground state. The strength is calculated based on the term due to the Zeeman effect of the electron spin Hamiltonian $H_{gs}$.

In light of the above, according to the first embodiment of the present invention, in a measurement using a quantum sensor, the range of measurable physical quantities can be increased while maintaining sensor sensitivity. This can increase the dynamic range of measurable physical quantities. In the first embodiment that measures the alternating magnetic field, the dynamic range of measurable alternating magnetic fields can be increased.

In the measuring device 10 according to one embodiment of the present invention, when the magnetic resonance signal is detected as a change in luminescence intensity by optically detected magnetic resonance (ODMR), the physical quantity of the measurement target is measured using light, rather than electricity; thus, the physical quantity can be measured even in an environment of a relatively high magnetic field or a high electric field.

When a color center in diamond or a color center in silicon carbide (SiC) is used as the sensor element 1, the measuring device 10 can operate at room temperature (about 300 K) without using a cooling mechanism. A superconducting quantum interference device (SQUID), which is known as an example of advanced highly sensitive magnetic field sensors, requires a cooling mechanism using, for example, liquid nitrogen in order to maintain the superconducting state. In contrast, when a color center in diamond or a color center in silicon carbide (SiC) is used as the sensor element 1, the measuring device 10 does not need to comprise a cooling mechanism, and is thus more advantageous than other advanced magnetic field sensors in that it is easy to miniaturize the device and mount it on other devices (e.g., transportation equipment such as automobiles).

Second Embodiment

As an example of the physical quantities of a measurement target, the second embodiment of the present invention describes a case of measuring the strength of the static magnetic field generated from the measurement target.

Figure 7:
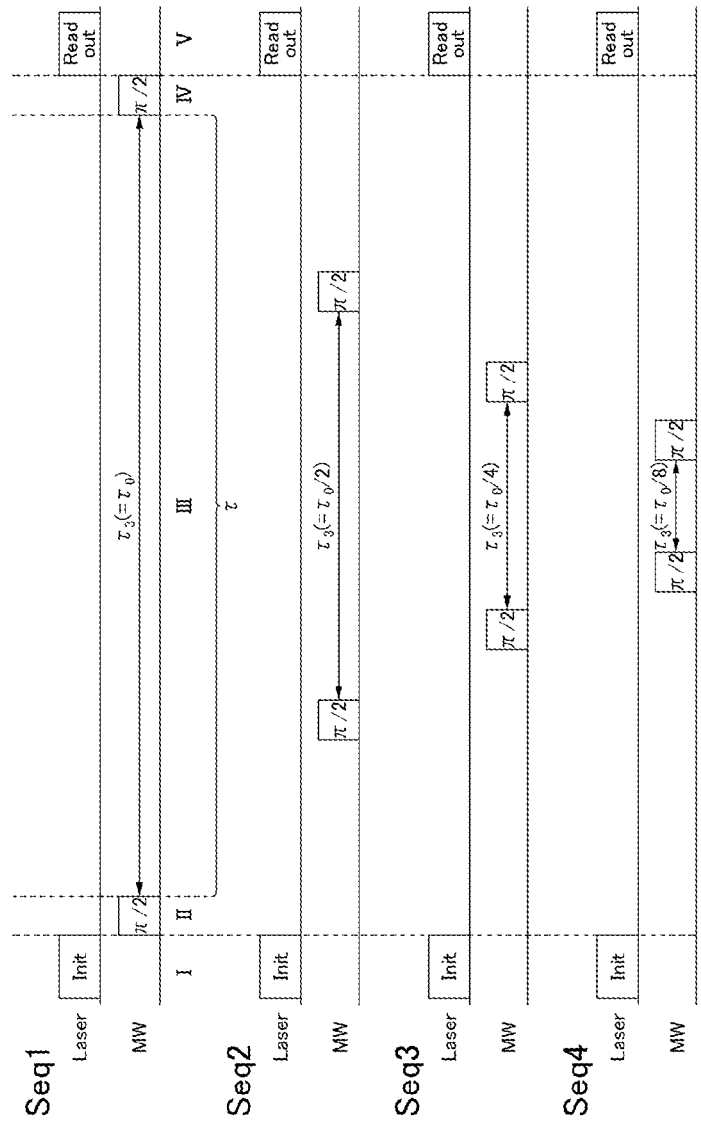
FIG. 7 shows pulse sequences in the case of static magnetic field sensing by a measuring method according to one embodiment of the present invention.

In the second embodiment that measures the strength of the static magnetic field, the detailed procedure of magnetic field sensing in step S2 is different from the procedure in the first embodiment that measures the strength of the alternating magnetic field. The other procedures are the same as those in the first embodiment.
Pulse Sequence FIG. 7 shows pulse sequences in the case of static magnetic field sensing by the measuring method according to one embodiment of the present invention. The pulse sequences of operation electromagnetic waves shown in FIG. 7 are based on Ramsey's method of the spin-echo method, and the time $\tau$ between Π/2 pulses is a variable value.

In the present embodiment, the magnetic resonance signal is measured while changing the pulse sequence of operation electromagnetic waves in the order from the first pulse sequence Seq1 to the fourth pulse sequence Seq4 shown in FIG. 7. In the exemplary pulse sequences of the present embodiment, the time $\tau_3$ of state III between the application of a Π/2 pulse in state II and the application of a Π/2 pulse in state IV is a variable value corresponding to the strength of the static magnetic field to be measured.

For example, when the time of state III in the first pulse sequence Seq1 is a time $\tau_0$, in the present embodiment, the time of state III in the second pulse sequence Seq2 is a time $\tau_0/2$, which is half of the time $\tau_0$ in the first pulse sequence Seq1. Similarly, the time of state III in the third pulse sequence Seq3 is a time $\tau_0/4$, which is one-fourth of the time $\tau_0$ in the first pulse sequence Seq1, and the time of state III in the fourth pulse sequence Seq4 is a time $\tau_0/8$, which is one-eighth of the time $\tau_0$ in the first pulse sequence Seq1.

For convenience of explanation, in the present embodiment, the timing of applying laser light for initializing the electron spin in state I, and the timing of applying laser light for reading the phase information and detecting the emitted light in state V is not supposed to change among the first pulse sequence Seq1 to the fourth pulse sequence Seq4.

Static Magnetic Field (Constant Magnetic Field) Sensing

Figure 8:
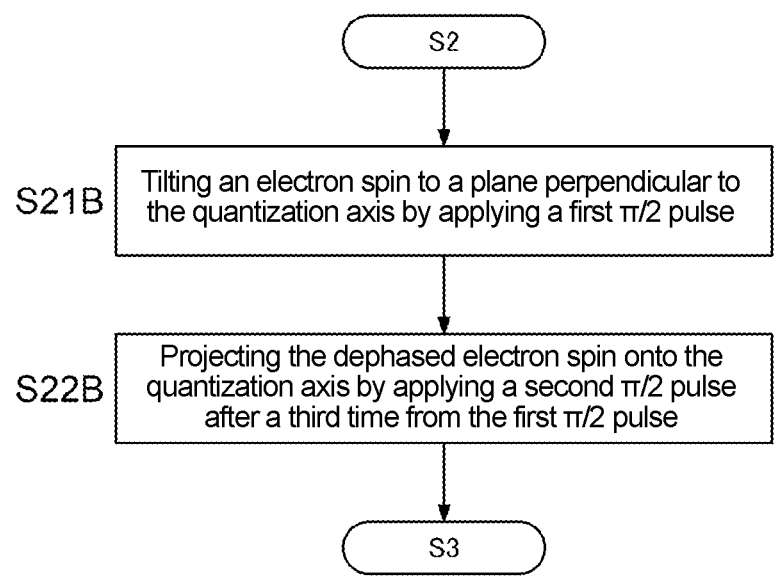
FIG. 8 is a flowchart showing the detailed procedure in the case of static magnetic field sensing.

FIG. 8 is a flowchart showing the detailed procedure in the case of static magnetic field sensing. The procedure in the case of static magnetic field sensing is described with reference to FIGS. 5 and 8.

The processing of step S1 is the same as the procedure in the first embodiment. The state of step S1 corresponds to state I of the pulse sequence shown in FIG. 7.

In step S2, magnetic field sensing is performed by irradiating the sensor element 1 with electromagnetic waves for spin operation. In the present embodiment, static magnetic field sensing is performed by the procedure shown in steps S21B to S22B of FIG. 8.

In step S21B, an operation is carried out to tilt the electron spin along the quantization axis to a plane perpendicular to the quantization axis by applying a first $\Pi/2$ pulse. The state of step S21B corresponds to state II of the pulse sequence shown in FIG. 7.

Then, the electron spin tilted to the x-y plane is dephased by interaction with the static magnetic field during a third time $\tau_3$. The third time $\tau_3$ is a variable value that differs for each pulse sequence corresponding to the strength of the static magnetic field to be measured. The state in which the electron spin is dephased during the third time $\tau_3$ corresponds to state III of the pulse sequence shown in FIG. 7.

After the elapse of the third time $\tau_3$ from the first $\Pi/2$ pulse, in step S22B, an operation is carried out to project the dephased electron spin onto the quantization axis by applying a second $\Pi/2$ pulse. The state of step S22B corresponds to state IV of the pulse sequence shown in FIG. 7.

The processing of step S3 is the same as the procedure in the first embodiment. The state of step S3 corresponds to state V of the pulse sequence shown in FIG. 7.

Afterward, in the same manner as the procedure in the first embodiment, the number of times of executing measurement processing is determined in step S4, and the series of measurement processing of steps S1 to S3 is executed repeatedly a predetermined number of times in step S5 while changing the pulse sequence used in the measurement to another pulse sequence in which the time between $\Pi/2$ pulses is changed. Thereafter, the strength of the magnetic field of the measurement target is calculated in step S6.

In light of the above, according to the second embodiment of the present invention, in a measurement using a quantum sensor, the range of measurable physical quantities can be increased while maintaining sensor sensitivity. This can increase the dynamic range of measurable physical quantities. In the second embodiment that measures the static magnetic field, the dynamic range of measurable static magnetic fields can be increased.

OTHER EMBODIMENTS

Specific embodiments of the present invention are described above; however, the present invention is not limited to the above embodiments.

In the above embodiments, a diamond crystal is used as the sensor element 1, and an NV center is used as the color center in diamond; however, usable color centers are not limited to NV centers. In place of NV centers, silicon-vacancy centers or germanium-vacancy centers can be used as the color center in diamond of the sensor element 1. Further, the color centers are also not limited to color centers of diamond crystals. Color centers of various crystals can be used for the sensor element 1.

In the above embodiments, the color center in diamond is used as the sensor element 1; however, the sensor element 1 used is not limited to the color center in diamond. Various quantum sensors, such as a color center in silicon carbide (SiC), an optically pumped atomic magnetometer (OPM), and a superconducting quantum interference device (SQUID), can be used as the sensor element 1 in place of the color center in diamond, as long as the sensor element 1 can be irradiated with electromagnetic waves to operate the electron spin state.

In the above embodiments, the magnetic resonance signal related to the electron spin state after the interaction is detected as a change in luminescence intensity by optically detected magnetic resonance (ODMR); however, the method of measuring the magnetic resonance signal is not limited thereto. The pulse sequences by the method of the present invention can be similarly applied to methods of measuring magnetic resonance signals without using optically detected magnetic resonance (ODMR), as long as pulse sequences based on the spin-echo method are used to measure magnetic resonance signals.

For example, the magnetic resonance signal can be measured by known electrically detected magnetic resonance (EDMR). In electrically detected magnetic resonance (EDMR), photoexcitation of the sensor element 1, such as color center in diamond, generates a spin state-dependent photocurrent. This photocurrent is generated by the difference in the lifetime of the excited state depending on the spin state. The detection part 32 detects the electrical resistance of the sensor element 1 (or photocurrent generated in the sensor element 1), thereby detecting the magnetic resonance signal as a change in electrical resistivity (or a change in photocurrent due to light irradiation). That is, the detection part 32 functions as an electrical detection part. For example, a known ammeter can be used as the detection part 32.

In the above embodiments, the magnetic resonance signal is measured while changing the pulse sequence of operation electromagnetic waves in the order from the four pulse sequences Seq1 to Seq4 shown in FIG. 4 or 7; however, the number of pulse sequences used is not limited to 4, but may be plural, and the order of changing a plurality of pulse sequences is also not limited. Further, the combined ratio of a plurality of pulse sequences can be suitably changed, as described in the Examples, provided later.

In the above embodiments, in the pulse sequences in the case of alternating magnetic field sensing shown in FIG. 2, the timing of state I and the timing of state VII do not change between the multiple pulse sequences; however, the timing of state I and the timing of state VII may change between the multiple pulse sequences.

For example, in the above embodiments, there is a blank time between the timing of state I and the timing of state II in the second pulse sequence Seq2; however, the timing of state I may be delayed so that the timing of state II is set immediately after the timing of state I. Similarly, in the second pulse sequence Seq2, the timing of state VII may be advanced so that the timing of state VII is set immediately after the timing of state VI. The third pulse sequence Seq3 and the fourth pulse sequence Seq4 are the same as the second pulse sequence Seq2. Further, in the pulse sequences in the case of static magnetic field sensing shown in FIG. 7, the same applies to the timing of state I and the timing of state V.

In the above embodiments, in the multiple pulse sequences in the case of alternating magnetic field sensing shown in FIG. 2, the time $\tau_1$ of state III between the multiple pulse sequences is a multiple number (=$\tau_0$, $\tau_0/2$, $\tau_0/4$, $\tau_0/8$); however, the relationship of the length of the time $\tau_1$ of state III between these pulse sequences is not limited to a multiple number. For example, the time $\tau_1$ of state III in the second pulse sequence Seq2 and the third pulse sequence Seq3 may be a multiple number (=$\tau_0/2$, $\tau_0/4$) of the time $\tau_1$ of state III in the first pulse sequence Seq1, and only the time $\tau_1$ of state III in the fourth pulse sequence Seq4 may be, for example, a time $\tau_0/5$, which is one-fifth of the time $\tau_0$ of state III in the first pulse sequence Seq1. That is, the relationship of the length of the time $\tau_1$ between the multiple pulse sequences Seq1 to Seq4 can be any value, rather than a multiple number (=$\tau_0$, $\tau_0/2$, $\tau_0/4$, $\tau_0/8$). Not only the time $\tau_1$ of state III, the time $\tau_2$ of state V can also be any value between the multiple pulse sequences. Further, the time $\tau_3$ of state III in the pulse sequences in the case of static magnetic field sensing shown in FIG. 7 can also be any value between the multiple pulse sequences. Thus, the time $\tau$ between $\Pi/2$ pulses is any value, and can be set as a variable value over the multiple pulse sequences.

In the above embodiments, in the pulse sequences in the case of alternating magnetic field sensing shown in FIG. 2, the time $\tau_1$ of state III and the time $\tau_2$ of state V are the same length of time; however, these times $\tau_1$ and $\tau_2$ are not necessarily the same length of time. When the times $\tau_1$ and $\tau_2$ are sufficiently shorter than the reference time $\tau_0$ of the first pulse sequence Seq1 (e.g., $\tau_1$, $\tau_2$=about $\tau_0/2^8$), the times $\tau_1$ and $\tau_2$ can be varied in the pulse sequences of the alternating magnetic field shown in FIG. 2. That is, when the times $\tau_1$ and $\tau_2$ are sufficiently short, it is not necessary to set the time $\tau_1$ of state III and the time $\tau_2$ of state V symmetrically with respect to state IV, which is an inflection point.

In the above embodiments, the physical quantity of the measurement target is a magnetic field (alternating magnetic field or static magnetic field); however, it is not limited to magnetic fields. Electric fields, temperatures, and dynamic quantities (e.g., dynamic stress and pressure) can be used as the physical quantities of the measurement target. These physical quantities are related to the interaction with the electron spin, and can be calculated based on the electron spin Hamiltonian.

In the above embodiments, when the measured value of the strength of the alternating magnetic field is determined, a plurality of results (magnetic resonance signal related to the spin state, i.e., phase information) using a plurality of pulse sequences with different times between $\Pi/2$ pulses are combined based on Bayes' theorem; however, the method used to combine the multiple results is not limited to Bayes' theorem, i.e., Bayes' estimation. For example, the maximum a posteriori estimation method, maximum likelihood estimation, or the like can be used in place of Bayes' estimation. Such methods for estimating the characteristics of a population from a sample group are known as methods of inferential statistics.

EXAMPLES

Examples of the present invention are shown below to further clarify the features of the present invention. In Examples 1 to 3 described below, the magnetic field strength was measured and simulated based on the measuring method according to the first embodiment. An NV center in diamond was used as the sensor element.

Example 1

In Example 1, the strength of a known alternating magnetic field previously applied at any strength to a sample to be measured was actually measured, and the deviation between the value of the magnetic field strength actually applied to the sample (set value) and the measured value was confirmed. Further, a static magnetic field was also measured and confirmed in the same manner as for the alternating magnetic field, based on the measuring method according to the second embodiment.

Figure 9:
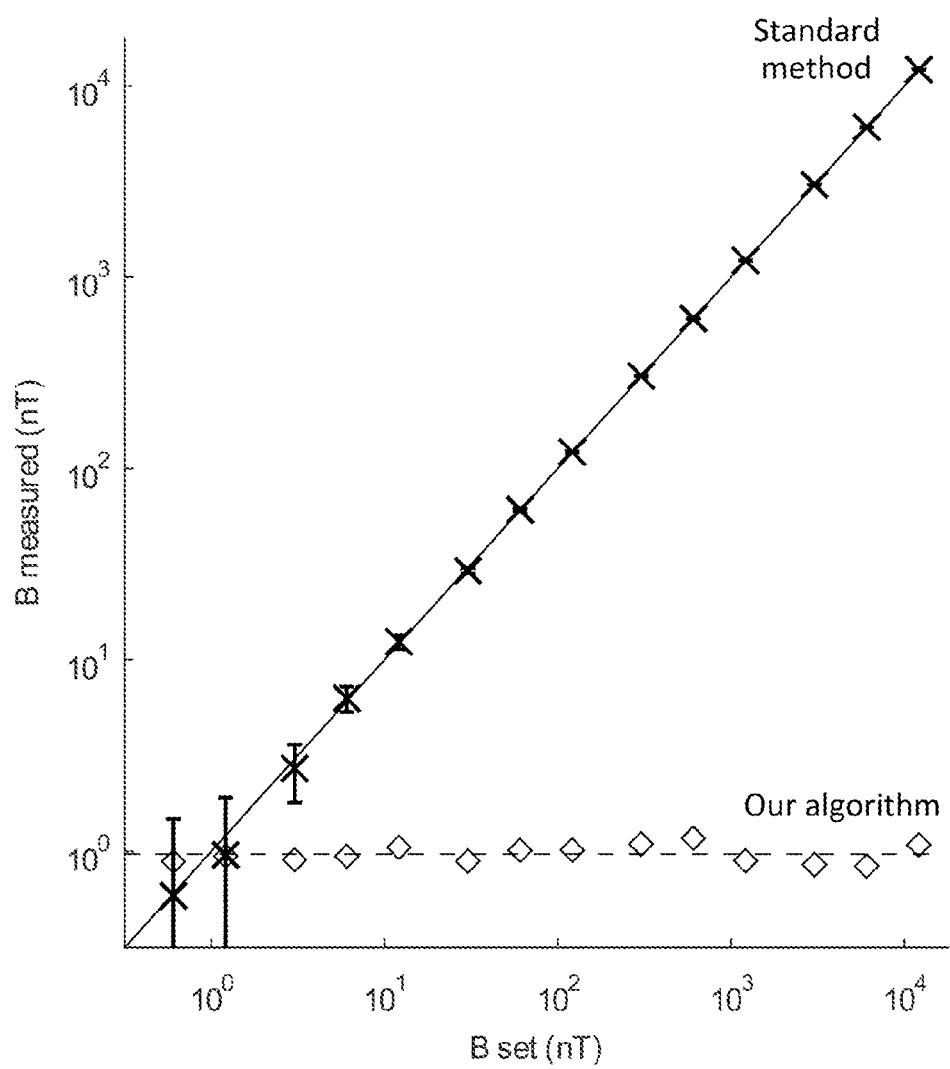
FIG. 9 is data showing the results of measuring the strength of an alternating magnetic field in Example 1.
Figure 10:
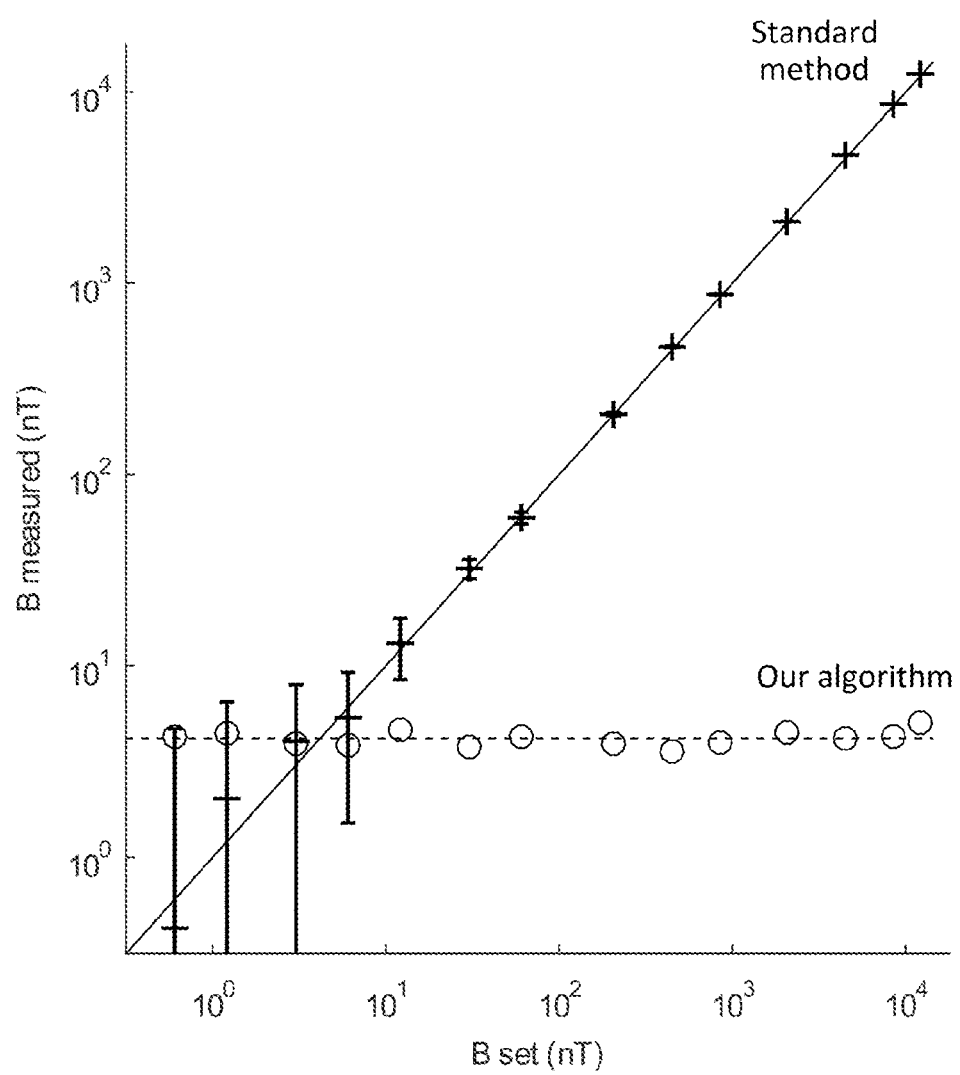
FIG. 10 is data showing the results of measuring the strength of a static magnetic field in Example 1.

FIG. 9 is data showing the results of measuring the strength of the alternating magnetic field in Example 1. FIG. 10 is data showing the results of measuring the strength of the static magnetic field in Example 1.

In FIGS. 9 and 10, the horizontal axis of the graph indicates the applied magnetic field strength, and the vertical axis indicates the measured magnetic field strength. In FIG. 9, the measured values of the alternating magnetic field measured by a standard method are plotted with the cross symbols "x," and the quantities (uncertainty) proportional to the sensitivity of the alternating magnetic field in the pulse sequences according to the present invention used in the measurement are plotted with the diamond symbols "◇." In FIG. 10, the measured values of the static magnetic field measured by a standard method are plotted with the plus symbols "+," and the quantities (uncertainty) proportional to the sensitivity of the static magnetic field in the pulse sequences according to the present invention used in the measurement are plotted with the circle symbols "○."

The alternating magnetic field was measured using 9 pulse sequences, i.e., $A_0$, $A_0/2$, $A_0/4$, $A_0/8$, $A_0/16$, $A_0/32$, $A_0/64$, $A_0/128$, and $A_0/256$, by equally combining these multiple pulse sequences at the same ratio. Similarly, the static magnetic field was measured using 8 pulse sequences, i.e., $A_0$, $A_0/2$, $A_0/4$, $A_0/8$, $A_0/16$, $A_0/32$, $A_0/64$, and $A_0/128$, by equally combining these multiple pulse sequences at the same ratio.

As shown in the measurement results of FIGS. 9 and 10, it was confirmed that the sensitivity of the magnetic field did not change in each measurement. Further, the strength of the magnetic field (alternating magnetic field or static magnetic field) applied as a set value to the sample in each measurement was ranging from less than 1 nT (nanotesla) to about 10,000 nT or more. The range of the magnetic field strength corresponded to $10^4$ or more in the dynamic range.

Example 2

In Example 2, the measured value and the simulated value were compared for measurement sensitivity.

Figure 11:
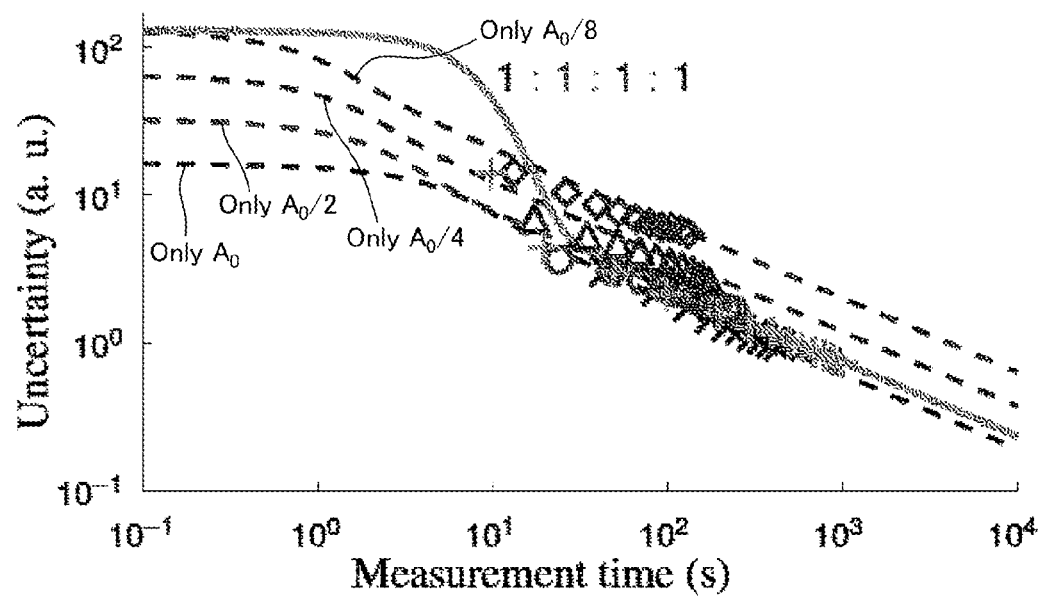
FIG. 11 is a graph showing the relationship between measurement sensitivity and measurement time in Example 2.

FIG. 11 is a graph showing the relationship between measurement sensitivity and measurement time in Example 2. In the graph, the symbol plots represent measured values, and the solid or dashed lines represent simulated values (theoretical values) from theoretical calculations.

The measured values using a plurality of pulse sequences with different times $\tau$ between $\Pi/2$ pulses by the method of the present invention are plotted with the plus symbols "+," and the simulated values are represented by the solid line. In this Example, during the period in which the magnetic resonance signal is repeatedly measured and the signal intensity is integrated, the combined ratio of the first pulse sequence Seq1 to the fourth pulse sequence Seq4 is equal (1:1:1:1).

A first comparative example is the result of the first pulse sequence Seq1 alone. The measured values are plotted with the cross symbols "x," and the simulated values are represented by the sign "$A_0$" using a dashed line. A second comparative example is the result of the second pulse sequence Seq2 alone. The measured values are plotted with the circle symbols "○," and the simulated values are represented by the sign "$A_0/2$" using a dashed line. A third comparative example is the result of the third pulse sequence Seq3 alone. The measured values are plotted with the triangle symbols "Δ," and the simulated values are represented by the sign "$A_0/4$" using a dashed line. A fourth comparative example is the result of the fourth pulse sequence Seq4 alone. The measured values are plotted with the diamond symbols "◊," and the simulated values are represented by the sign "$A_0/8$" using a dashed line.

As can be understood with reference to FIGS. 15 and 2, the first pulse sequence Seq1 shown in FIG. 2 is the same as the conventional pulse sequence shown in FIG. 15. Accordingly, the measurement result of the first pulse sequence Seq1 alone shown as the first comparative example is the same as the measurement result of the conventional pulse sequence. Therefore, in the graph shown in FIG. 11, the degree of change in measurement sensitivity can be grasped by comparing the results of the multiple pulse sequences by the method of the present invention with the result of the first comparative example. For example, it can be said that the reduction in measurement sensitivity is suppressed as the results of the multiple pulse sequences by the method of the present invention approach the result of the first comparative example.

With reference to FIG. 11, in the result of the even combination of the multiple pulse sequences by the method of the present invention represented by the solid line, the measurement sensitivity increases rapidly at a measurement time of around 30 to 40 seconds shown on the horizontal axis of the graph, and approaches the dashed line of the first comparative example represented by the sign "$A_0$." Therefore, it was demonstrated that the measurement using a plurality of pulse sequences with different times τ between Π/2 pulses by the method of the present invention maintained the same level of measurement sensitivity as the measurement using the conventional pulse sequence.

Example 3

In Example 3, the combined ratios of the first pulse sequence Seq1 to the fourth pulse sequence Seq4 were simulated by theoretical calculations, and an optimal combined ratio was examined.

Figure 12:
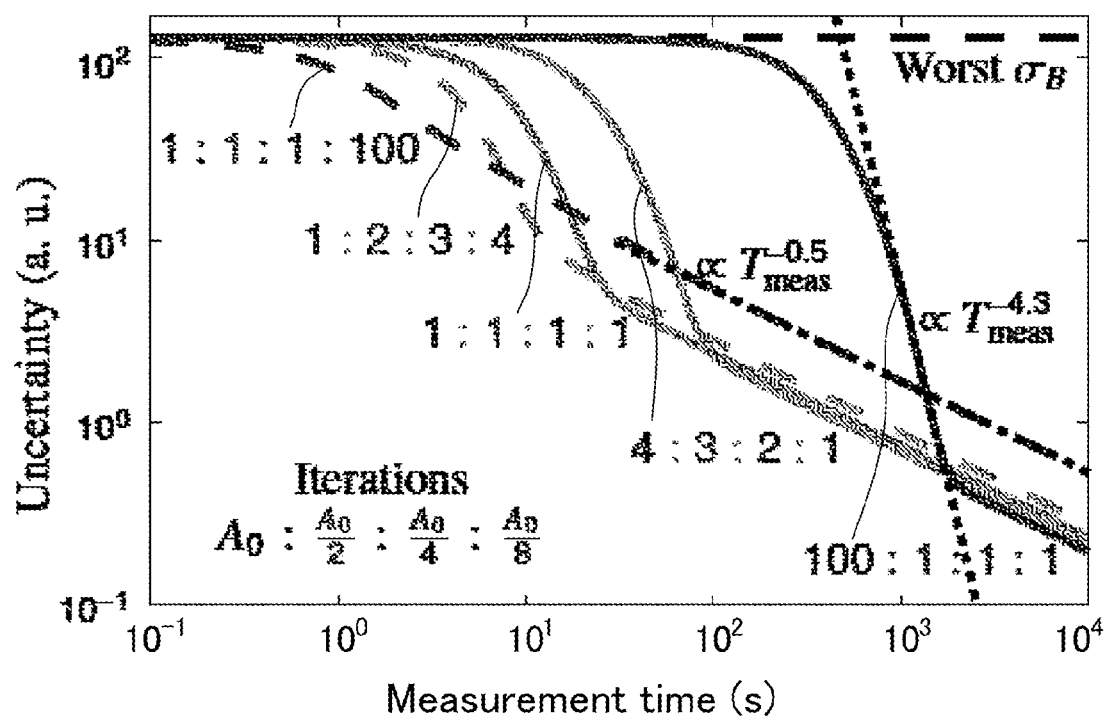
FIG. 12 is a graph of simulated values showing the relationship between measurement sensitivity and measurement time in Example 3.

FIG. 12 is a graph of simulated values showing the relationship between measurement sensitivity and measurement time in Example 3. In the simulation by theoretical calculations, the combined ratios of the first pulse sequence Seq1 to the fourth pulse sequence Seq4 were changed in the following 5 patterns. The combined ratio described below is Seq1:Seq2:Seq3:Seq4 (i.e., $A_0:A_0/2:A_0/4:A_0/8$).

The first combination is a combined ratio of 1:1:1:100. The second combination is a combined ratio of 1:2:3:4. The third combination is a combined ratio of 1:1:1:1. The fourth combination is a combined ratio of 4:3:2:1. The fifth combination is a combined ratio of 100:1:1:1.

Referring to FIG. 12, it was demonstrated that the measurement time for reaching the required measurement sensitivity was changed by changing the combined ratio of the first pulse sequence Seq1 to the fourth pulse sequence Seq4. Therefore, referring to the graph of the simulation results shown in FIG. 12, it was demonstrated that in a comprehensive consideration of the required measurement sensitivity, the range of measurable physical quantities (dynamic range), and the measurement time, the combined ratio of a plurality of pulse sequences with different times τ between Π/2 pulses could be optimized by the method of the present invention.

Example 4

In Example 4, the same measurement as in Example 1 was performed, and the magnetic field range was further increased to confirm the deviation between the value of the magnetic field strength actually applied to the sample (set value) and the measured value. The measurements were performed several times. The dynamic range that was improved from that of Example 1 was measured in the measurements performed several times.

Figure 13:
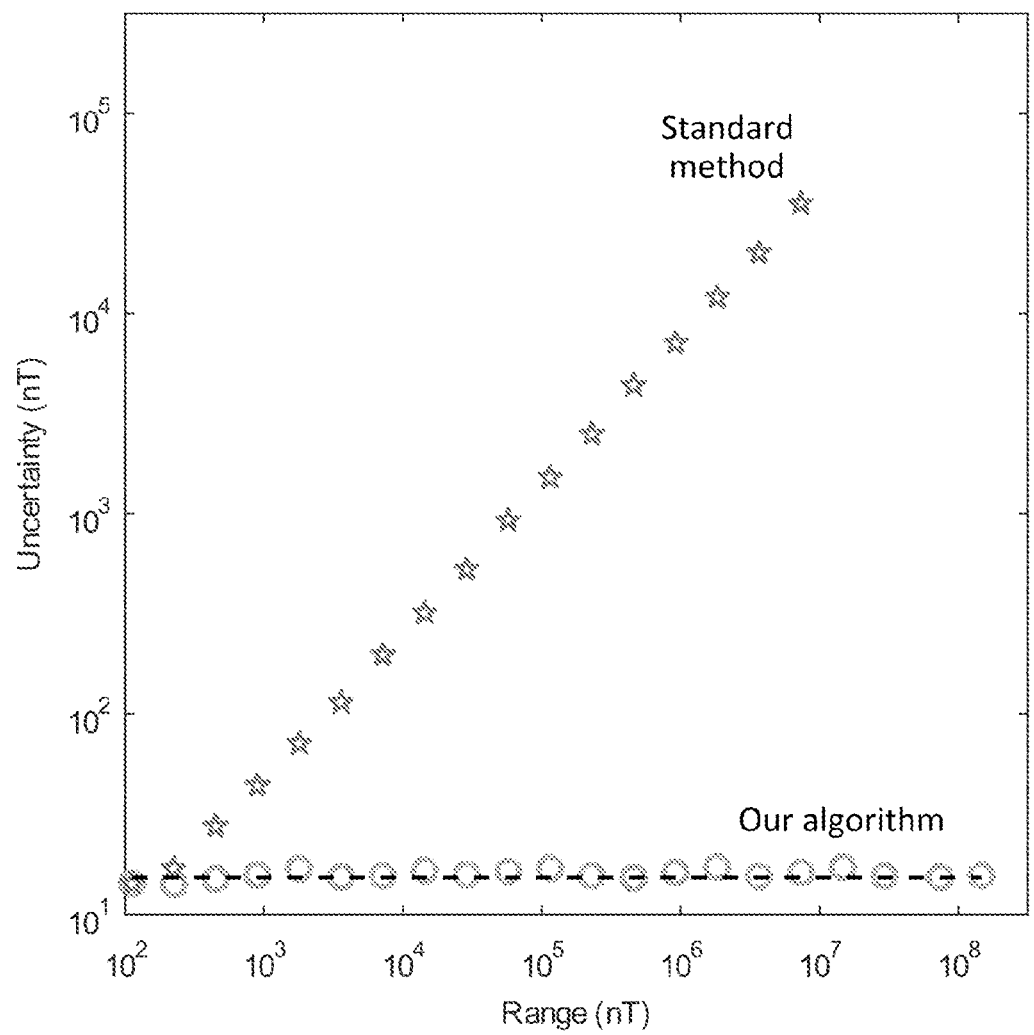
FIG. 13 is data showing the results of measuring the strength of an alternating magnetic field in Example 4.

FIG. 13 is experimental data showing the relationship between the alternating magnetic field range and the quantities (uncertainty) proportional to the sensitivity of the alternating magnetic field in Example 4. In FIG. 13, the horizontal axis of the graph represents the range of the applied magnetic field, and the vertical axis represents the quantities (uncertainty) proportional to the sensitivity of the alternating magnetic field. In FIG. 13, the measured values of the alternating magnetic field measured by a standard method are plotted with the star symbols "☆," and the quantities (uncertainty) proportional to the sensitivity of the alternating magnetic field increase as the magnetic field range is increased. On the other hand, the quantities (uncertainty) proportional to the sensitivity of the alternating magnetic field with the pulse sequences by the present invention are plotted with the circle symbols "○)," and are maintained even when the magnetic field range is increased.

As shown in the measurement results of FIG. 13, it was confirmed that the sensitivity of the magnetic field was not changed in the measurements. The strength of the alternating magnetic field applied as a set value to the sample in the measurements was ranging from about $10^2$ nT (nanotesla) to about $10^8$ nT, and the maximum value in the range of the magnetic field strength corresponded to $10^7$ with respect to the sensor sensitivity (to 10 $nT/(Hz)^{1/2}$) used this time.

REFERENCE SIGNS LIST

1. Sensor element
2. Irradiation unit
3. Physical quantity measuring unit
8. Interaction
9. Measurement target
10. Measuring device
11. Probe
21. Operation electromagnetic wave irradiation part
31. Light irradiation part
32. Detection part
33. Data processing part
99. Network

The invention claimed is:
1. A measuring device comprising:
an irradiation unit that irradiates a quantum sensor element with electromagnetic waves for operating an electron spin state of the quantum sensor element that changes due to interaction with a measurement target, in a pulse sequence in which a time τ between π/2 pulses is a variable value according to the intensity of a physical quantity of the measurement target; and a physical quantity measuring unit that calculates the physical quantity of the measurement target based on the electron spin state after the interaction with the measurement target.

2. A measuring method comprising the steps of:

irradiating a quantum sensor element with electromagnetic waves for operating an electron spin state of the quantum sensor element that changes due to interaction with a measurement target, in a pulse sequence in which a time τ between π/2 pulses is a variable value according to the intensity of a physical quantity of the measurement target; and calculating the physical quantity of the measurement target based on the electron spin state after the interaction with the measurement target.

3. The measuring device according to claim 1, wherein the irradiation unit irradiates the quantum sensor element with the electromagnetic waves for operation in a plurality of pulse sequences with different times τ between π/2 pulses.

4. The measuring device according to claim 3, wherein the physical quantity measuring unit calculates the physical quantity by combining a plurality of the electron spin states in a plurality of the pulse sequences based on a method of inferential statistics.

5. The measuring device according to claim 4, wherein the method of inferential statistics is Bayes' estimation.

6. The measuring device according to claim 1, wherein the pulse sequence comprises:

application of a first π/2 pulse to tilt an electron spin along a quantization axis to a plane perpendicular to the quantization axis, application of a π pulse to invert the electron spin dephased by the interaction with the measurement target in the plane after a first time $\tau_1$ from the first π/2 pulse, and application of a second π/2 pulse to project the dephased electron spin onto the quantization axis after a second time $\tau_2$ from the π pulse; and wherein the first time $\tau_1$ and the second time $\tau_2$ are variable values according to the intensity of the physical quantity of the measurement target.

7. The measuring device according to claim 1, wherein the pulse sequence comprises:

application of a third π/2 pulse to tilt an electron spin along a quantization axis to a plane perpendicular to the quantization axis, and application of a fourth π/2 pulse to project the electron spin dephased by the interaction with the measurement target onto the quantization axis after a third time $\tau_3$ from the third π/2 pulse; and wherein the third time $\tau_3$ is a variable value according to the intensity of the physical quantity of the measurement target.

8. The measuring device according to claim 1, wherein the physical quantity measuring unit comprises:

a light irradiation part that irradiates the quantum sensor element with light for reading phase information of the electron spin state after the interaction with the measurement target;

a detection part that detects a change generated in the quantum sensor element due to the irradiation of the light; and a data processing part that reads the phase information from the detected change and calculates the physical quantity based on the read phase information.

9. The measuring device according to claim 1, wherein the quantum sensor element is a sensor element having a color center.

10. The measuring device according to claim 9, wherein the color center is a complex of nitrogen (N) replacing a carbon atom and a vacancy (V) adjacent to the nitrogen.

11. The measuring device according to claim 1, wherein the physical quantity measuring unit calculates at least one of a magnetic field, an electric field, a temperature, and a dynamic quantity as the physical quantity related to interaction with the electron spin.

12. The measuring method according to claim 2, wherein the step of calculating the physical quantity comprises:

irradiating the quantum sensor element with light for reading phase information of the electron spin state after the interaction with the measurement target;

detecting a change generated in the quantum sensor element due to the irradiation of the light; and reading the phase information from the detected change and calculating the physical quantity based on the read phase information.

\* \* \* \* \*